United States Patent
Wrobel et al.

(10) Patent No.: US 10,135,449 B2
(45) Date of Patent: Nov. 20, 2018

(54) PHASE DETECTION METHOD BASED ON A PLURALITY OF CONSECUTIVE VALUES OF A RECEIVING SIGNAL

(71) Applicant: SONOVUM AG, Leipzig (DE)

(72) Inventors: Miroslaw Wrobel, Karlstadt (DE); Adam Kolany, Leipzig (DE)

(73) Assignee: SONOVUM AG, Leipzig (DE)

( * ) Notice: Subject to any disclaimer, the term of this patent is extended or adjusted under 35 U.S.C. 154(b) by 0 days.

(21) Appl. No.: 15/517,451

(22) PCT Filed: Oct. 14, 2015

(86) PCT No.: PCT/EP2015/073735
§ 371 (c)(1),
(2) Date: Apr. 6, 2017

(87) PCT Pub. No.: WO2016/059088
PCT Pub. Date: Apr. 21, 2016

(65) Prior Publication Data
US 2017/0302283 A1    Oct. 19, 2017

(30) Foreign Application Priority Data
Oct. 14, 2014   (DE) .................... 10 2014 015 127

(51) Int. Cl.
*H03L 7/091* (2006.01)
*G01R 19/25* (2006.01)
(Continued)

(52) U.S. Cl.
CPC .............. *H03L 7/091* (2013.01); *G01R 19/25* (2013.01); *H03L 7/089* (2013.01); *H04L 7/033* (2013.01); *H04L 27/2334* (2013.01)

(58) Field of Classification Search
CPC ......... H03L 7/091; H03L 7/089; G01R 19/25; H04L 7/033; H04L 27/2334
See application file for complete search history.

(56) References Cited

U.S. PATENT DOCUMENTS 5,854,995 A    12/1998  Plis et al.
6,246,267 B1    6/2001  Barsoum et al.
(Continued)

FOREIGN PATENT DOCUMENTS

DE     4205300 C1      7/1993
WO  2010045978 A1      4/2010
WO  2011107801 A1      9/2011

OTHER PUBLICATIONS

PCT International Search Report, PCT/EP2015/073735, dated Jan. 7, 2016.
(Continued)

*Primary Examiner* — Janice N Tieu
(74) *Attorney, Agent, or Firm* — Quarles & Brady LLP

(57) ABSTRACT

The invention relates to a phase detection method. A plurality of consecutive values of a receiving signal with a known sampling frequency $f_s$ are received as a reaction to a transmitting signal having a known transmitting frequency $f_w$. Two differential values are determined, each coming from two consecutive values out of three consecutive values of the receiving signal. A phase real part and a phase imaginary part of the receiving signal are determined based on a linear relation between the phase real part, the phase imaginary part and the two differential values.

15 Claims, 4 Drawing Sheets

(51) Int. Cl.
H03L 7/089 (2006.01)
H04L 7/033 (2006.01)
H04L 27/233 (2006.01)

(56) References Cited

U.S. PATENT DOCUMENTS 7,587,170 B1 * 9/2009 Lee .................. H04B 1/1653
455/214
2001/0055355 A1 * 12/2001 Okamoto .......... G11B 20/1426
375/355
2012/0068748 A1 * 3/2012 Stojanovic ............ H03L 7/0807
327/161

OTHER PUBLICATIONS

PCT English Language Translation of the International Preliminary Report on Patentability, PCT/EP2015/073735, dated Apr. 27, 2017.

* cited by examiner

PHASE DETECTION METHOD BASED ON A PLURALITY OF CONSECUTIVE VALUES OF A RECEIVING SIGNAL

CROSS-REFERENCE TO RELATED APPLICATIONS

This application represents the national stage entry of PCT International Application No. PCT/EP2015/073735 filed Oct. 14, 2015, which claims priority of German Patent Application 10 2014 015 127.1, filed Oct. 14, 2014, the contents of which are hereby incorporated herein by reference for all purposes.

BACKGROUND

The present invention relates to a phase detection method and a processor for determining a phase of a receiving signal based on a plurality of consecutive values of a receiving signal.

Exactly determining the phase of an output signal at the outlet of a transferring medium when being stimulated by an input signal of a known frequency at the inlet is of great importance for a number of applications. The phase information in coding methods in communications engineering can, for example, be used for transmitting communications in the form of electric, magnetic or electromagnetic signals via a communications channel. In the area of materials sciences, measuring the phase of an acoustic wave provides information on the material composition of the transferring medium. In chemical and physical analyzing systems, phase detectors are used for determining temperature, density, phase changes in chemical reactions, object dimensions and concentration of liquids in chemical and physical media. In medical diagnostic methods, tissue characteristics are identified by measuring the phase of acoustic and ultrasonic signals being coupled in. Applications for these purposes include monitoring blood circulation in the body in order to recognize abnormal conditions, in particular in the brain, and mammary sonography.

FIG. 1 shows a schematic view of a system 100 for measuring phase relations of acoustic waves in a vessel 102. The system 100 comprises a vessel 102 which is to be measured, e.g. a body cell, a blood vessel or an artery having a vessel length L and a transmitter 101 and a receiver 103 of ultrasonic waves. The transmitter 101 couples an ultrasonic wave 104 of a known frequency $f_0$ comprising a phase $\varphi_0$ into the vessel 102 at the inlet 105 of the vessel 102, where said ultrasonic wave 104 spreads and is received at the outlet 107 by the receiver 103. As can be seen in FIG. 1, the ultrasonic wave 104 comprises an integer number of oscillatory periods P as well as a partial period, which can be represented as a phase difference $\varphi_1-\varphi_0$. Between the running time $T_P$ the acoustic wave 104 and the phase difference $\varphi_1-\varphi_0$, the following condition applies:

$$2\pi \cdot f_0 T_P = 2\pi P + (\varphi_1 - \varphi_0). \tag{1}$$

For the phase velocity V in the vessel 102, the following condition applies on the one hand:

$$V = \lambda \cdot f_0, \tag{2}$$

wherein $f_0$ denotes the known transmitting frequency and $\lambda$ denotes the wave length in the vessel 102. On the other hand, the following condition applies for the phase velocity V in the vessel 102:

$$V = \sqrt{\frac{K}{\rho}}, \tag{3}$$

wherein K denotes the elasticity of the vessel and $\rho$ denotes its density. The characteristics of the vessel 102 can therefore be determined from the phase velocity V. The wave length $\lambda$ can be determined from the amount of periods P and from the phase difference $\varphi_1-\varphi_0$, and the phase velocity V can be identified by means of the known transmitting frequency $f_0$, the material characteristics of the vessel 102 being able to be characterized by means of the phase velocity V.

Generally, the receiver is synchronized with the transmitter in order to determine the phase difference $\varphi_1-\varphi_0$ and the received signal is sampled with an analog-to-digital converter. The sampling value of the received signal can be correlated with the point of time of synchronization from which the phase difference can be determined.

However, the measuring accuracy depends on a plurality of system parameters, such as the sampling accuracy, the accuracy of the set frequency of the transmitting signal, the coupling and uncoupling accuracy of the acoustic signal, interferences of the transmitting signal due to reflections at the vessel ends and vessel walls, Doppler effects, etc.

SUMMARY

The object of the present invention is to create a concept for simply and precisely determining the phase at the outlet of a transferring medium when being stimulated by a transmitting signal of a known signal characteristic.

This object is attained by the features of the independent claims. Further advantageous embodiments are the subject matter of the dependent claims.

The methods, devices and systems described in the following can be of different types. The individual elements described can be realized via hardware or software components, such as electronic components, which are produced using different technologies and can comprise semiconductor chips, ASICs, microprocessors, digital signal processors, integrated electric circuits, electro-optic circuits and/or passive components.

According to a first aspect, the invention relates to a phase detection method comprising the following steps: receiving a plurality of consecutive values of a receiving signal with a known sampling frequency $f_s$ as a reaction to a transmitting signal having a known transmitting frequency $f_w$; determining two differential values each from two consecutive values out of three consecutive values of the receiving signal; and determining a phase real part and a phase imaginary part of the receiving signal based on a linear relation between the phase real part, the phase imaginary part and the two differential values.

This has the advantage that the phase is able to be easily and precisely determined at the outlet of a transferring medium when being stimulated by a transmitting signal of a known signal characteristic. The linear relation between the phase real part, the phase imaginary part and the two differential values can be determined with little effort and provides precise values for the phase of the receiving signal when the transmitting frequency and the sampling frequency are known.

According to an embodiment of the phase detection method, the linear relation between the phase real part, the phase imaginary part and the two differential values can be represented via a two-dimensional linear system of equations based on the two differential values as input variables and the phase real part and the phase imaginary part as output variables.

This has the advantage that the two-dimensional linear system of equations is easily solvable and the terms for the phase real part and the phase imaginary part are able to be easily represented and thus can be easily determined. The phase can thus be determined with little effort.

According to an embodiment of the phase detection method, the linear system of equations is solved by weighting of the input variables with Fourier Coefficients, which are based on a known circular frequency $\Omega$, said known circular frequency depending on the transmitting frequency and the sampling frequency.

This has the advantage that the linear system of equations is able to be easily solved by means of the Fourier Coefficients when the values of the transmitting frequency $f_w$ and the sampling frequency $f_s$ are known.

According to an embodiment of the phase detection method, the known circular frequency satisfies the condition $\Omega=2\pi(f_w/f_s)$.

According to an embodiment, the phase detection method comprises determining the Fourier Coefficients in dependence of the known circular frequency $\Omega=2\pi(f_w/f_s)$ before determining the phase real part and the phase imaginary part of the receiving signal (Y).

This has the advantage that the Fourier Coefficients are able to be already determined beforehand and are able to be stored as parameters so that the method can be carried out very efficiently.

According to an embodiment, the phase detection method comprises determining a bias of the receiving signal based on a linear relation between the phase real part, the phase imaginary part, the bias and the three consecutive values of the receiving signal.

This has the advantage that the bias is able to be easily and precisely determined at the outlet of the transferring medium when being stimulated by a transmitting signal of a known signal characteristic. The linear relation between the already determined phase real part, the already determined phase imaginary part, the bias and the two differential values can be determined with little effort and provides precise values for the bias of the receiving signal when the transmitting frequency and the sampling frequency are known.

According to a second aspect, the invention relates to a processor for determining a phase of a receiving signal being received as a reaction to a transmitting signal with a known transmitting frequency $f_w$, said receiving signal having a known sampling frequency $f_s$, comprising: a first input register, a second input register and a third input register, which are configured for storing three consecutive values from a plurality of consecutive values of the receiving signal one after the other; a first internal register and a second internal register, which are configured for storing a differential value as a difference of the content of the second input register and the content of the first input register and for storing a second differential value as a difference of the content of the third input register and the content of the second input register; a first output register and a second output register, which are configured for providing a phase real part and a phase imaginary part of the receiving signal; and a computing unit, which is configured for determining the phase real part and the phase imaginary part of the receiving signal based on a linear relation between the phase real part, the phase imaginary part and the two differential values.

This has the advantage that the processor is able to easily and precisely determine the phase at the outlet of a transferring medium when being stimulated by a transmitting signal of a known signal characteristic. The processor can determine the linear relation between the phase real part, the phase imaginary part and the two differential values with little effort and can thus provide precise values for the phase of the receiving signal.

According to an embodiment, the processor comprises a third output register, which is configured for providing a bias of the receiving signal, the computing unit being configured for determining the bias of the receiving signal based on a linear relation between the phase real part, the phase imaginary part, the bias and the three consecutive values of the receiving signal.

This has the advantage that the processor is able to easily and precisely determine the bias at the outlet of the transferring medium when being stimulated by a transmitting signal of a known signal characteristic. The processor can determine the linear relation between the already determined phase real part, the already phase imaginary part, the bias and the two differential values with little effort and can provide precise values for the bias of the receiving signal.

According to an embodiment, the processor comprises a first coefficient register, a second coefficient register, a third coefficient register and a fourth coefficient register, which are configured for storing Fourier Coefficients, said Fourier Coefficients determining the linear relation between the phase real part, the phase imaginary part and the two differential values.

This has the advantage that the processor is able to easily determine the linear relation by means of the Fourier Coefficients and is thus able to efficiently identify the phase when the values of the transmitting frequency $f_w$ and the sampling frequency $f_s$ are known.

According to an embodiment, the processor comprises a first parameter memory, which is configured for storing the cosine of the half of a known circular frequency $\Omega$, which depends on the transmitting frequency and the sampling frequency; a second parameter memory, which is configured for storing the sine of the half of the known circular frequency $\Omega$; a third parameter memory, which is configured for storing the cosine of the known circular frequency $\Omega$; and a fourth parameter memory, which is configured for storing the sine of the known circular frequency $\Omega$.

This has the advantage that the processor is able to determine the quantities required for determining the linear relation beforehand and is able to store these quantities in the four parameter memories or that these quantities already have been determined externally and are readily available in the four parameter memories when starting the processor. The phase can thus be determined very efficiently.

According to an embodiment of the processor, the known circular frequency satisfies the condition $\Omega=2\pi(f_w/f_s)$.

According to an embodiment of the processor, the computing unit is configured for determining the phase real part and the phase imaginary part of the receiving signal based on the contents of the four coefficient registers and the contents of the four parameter memories.

This has the advantage that the computing unit for determining the phase is able to work with already determined quantities readily available in the corresponding registers so that the processor can determine the phase with little computing effort.

According to an embodiment, the processor comprises an instruction unit, which is configured for initializing the first coefficient register with the content of the first parameter memory and for initializing the second coefficient register with the content of the second parameter memory in response to a reset signal; and for renewing the first coefficient register with the content of the third coefficient register and for renewing the second coefficient register with the content of the fourth coefficient register as a response to a clock signal.

This has the advantage that the processor is able to be set into a predetermined initial state by the reset signal and is able to determine the phase in every clock so that the phase can be determined very precisely and quickly.

According to an embodiment of the processor, the instruction unit is configured for loading the fourth coefficient register with the value $C_1 wS + S_1 wC$ and for loading the third coefficient register with the value $C_1 wC - S_1 wS$ in response to the clock signal, wherein wS denotes the content of the fourth parameter memory, wC denotes the content of the third parameter memory, $C_1$ denotes the content of the first coefficient register, $S_1$ denotes the content of the second coefficient register and $\Omega$ denotes the known circular frequency $\Omega = 2\pi (f_w/f_s)$.

This has the advantage that the processor is able to quickly determine the phase via the simple update rules $C_1 wS + S_1 wC$ and $C_1 wC - S_1 wS$, which can be executed in every clock by means of multiplication and addition operations.

According to an embodiment of the processor, the computing unit is configured for determining the phase real part as $$\frac{\Delta Y_1 \cdot S_2 - \Delta Y_2 \cdot S_1}{4hS \cdot hS \cdot hC}$$

and the phase imaginary part as $$\frac{\Delta Y_1 \cdot C_2 - \Delta Y_2 \cdot C_1}{4hS \cdot hS \cdot hC},$$

wherein hS denotes the content of the second parameter memory, hC denotes the content of the first parameter memory, $C_2$ denotes the content of the third coefficient register, $S_2$ denotes the content of the fourth coefficient register and $\Omega$ denotes the known circular frequency $\Omega = 2\pi (f_s/f_w)$.

This has the advantage that the processor is able to compute the phase using the simple equations described above, which the computing unit can quickly determine using the multiplication and addition operations and a normalization with a normalization factor.

According to an embodiment of the processor, the computing unit is configured for determining the bias as $Y_2 - (U \cdot (S_1 hC + C_1 hS) + V \cdot (C_1 hC - S_1 hS))$, wherein U denotes the phase real part, V denotes the phase imaginary part and $Y_2$ denotes the content of the second input register.

This has the advantage that the processor is able to compute the bias using the simple equation described above, which the computing unit can quickly determine by means of multiplication, addition and storing operations.

According to an embodiment, the processor comprises a first auxiliary register; a second auxiliary register; and a counter, which is incremented with each renewal of the three input registers in dependence of the clock signal, wherein the computing unit is configured for determining the phase real part as $\Delta Y_1 S_2 - \Delta Y_2 S_1$ and the phase imaginary part as $\Delta Y_1 C_2 - \Delta Y_2 C_1$, for adding the phase real part to the first auxiliary register and for adding the phase imaginary part to the second auxiliary register, wherein the instruction unit is configured for outputting the values of the two auxiliary registers divided by the value $2 \cdot wS \cdot hS = 4hS \cdot hS \cdot hC$ and divided by a value of the counter in response to an interruption signal, wherein $\Delta Y_1$ denotes the content of the first internal register, $\Delta Y_2$ denotes the content of the second internal register, $C_2$ denotes the content of the third coefficient register, $S_2$ denotes the content of the fourth coefficient register, hS denotes the content of the second parameter memory and hC denotes the content of the first parameter memory and $\Omega$ denotes the known circular frequency $\Omega = 2\pi (f_w/f_s)$.

This has the advantage that the processor is able to use the auxiliary registers for storing intermediate results so that the processor can very efficiently compute the phase by means of having access to the intermediate results and by being controlled by the interruption signal.

Determining the phase and the bias according to the aspects and embodiments described above is important for a number of usages. The phase determined in this manner or the bias determined in this manner, respectively, can be used in coding methods of communications technology for transferring messages in the form of electric, magnetic or electromagnetic signals via a communications channel. In the area of materials sciences, the phase determined in this manner or the bias determined in this manner, respectively, can give insight into the material characteristics of the transferring medium in terms of an acoustic wave. In chemical or physical analyzing systems, the phase determined in this manner or the bias determined in this manner, respectively, can be used for determining temperature, density, phase changes of chemical reactions, object dimensions and concentration of liquids in chemical and physical media.

In medical diagnostic methods, the phase or the bias, respectively, determined according to the aspects and embodiments described above can be used for identifying characteristics of tissues when acoustic and ultrasonic signals are coupled into said tissues. Embodiments of the invention are used for example when monitoring the circulation of blood in the body in order to recognize abnormal conditions, in particular in the brain, and in mammary sonography. The phase information can give insight into a healthy state as well as a diseased state of the tissue. Information can be gathered from a healthy patient regarding a healthy state of the tissue, for example, by means of measuring the phase according to the described methods and the described processors, respectively, said information serving as a type of reference value. Phase information which is found to deviate from the identified reference value during measurements on patients can be indicative of a patient's diseased state.

BRIEF DESCRIPTION OF THE DRAWINGS

Further embodiments are described by way of reference to the attached drawings. In the figures.

DETAILED DESCRIPTION

The following detailed description refers to the enclosed drawings, said drawings forming a part thereof and showing specific embodiments of implementing the invention for illustrative purposes. It is understood that other embodiments can also be used and structural or logical changes can be made without deviating from the concept of the present invention. The following detailed description is therefore not to be understood in a limiting sense. Moreover, it is understood that the features of the different exemplary embodiments described herein can be combined with each other, unless something else is specifically indicated.

The aspects and embodiments are described with reference to the drawings, with identical reference numbers generally referring to identical elements. In the following description, numerous specific details are described for the purpose of explaining the invention in order to enable thorough understanding of one or more aspects of the invention. However, it can be obvious to a skilled person that one or more aspects or embodiments can be implemented by a lesser degree of the specific details. In other cases, known structures and elements are shown in a schematic form in order to facilitate describing one or more aspects or embodiments. It is understood that other embodiments can be used and structural or logical changes can be implemented without deviating from the concept of the present invention.

Albeit a certain feature or a certain aspect of an embodiment regarding only one of several implementations may have been disclosed, such a feature or such an aspect can furthermore be combined with one or more other features or aspects of the other implementations, as may be desired or advantageous for any given or specific use. Furthermore, expressions such as "contain", "have", "with" or other variations thereof as used in the description or the claims are to be understood in an inclusive sense, like the meaning of "comprise". The expressions "coupled" and "connected" may have been used in conjunction with its derivatives. It is understood that such expressions are used for indicating that two elements cooperate or interact with each other independently of whether they are in direct physical or electric contact with each other or whether they are not in direct contact with each other. Moreover, the expressions "such as" and "for example" are to be understood merely as referring to an exemplary embodiment instead of a description of the best or the ideal embodiment. The following description is therefore not to be understood in a limiting sense.

Figure 2:
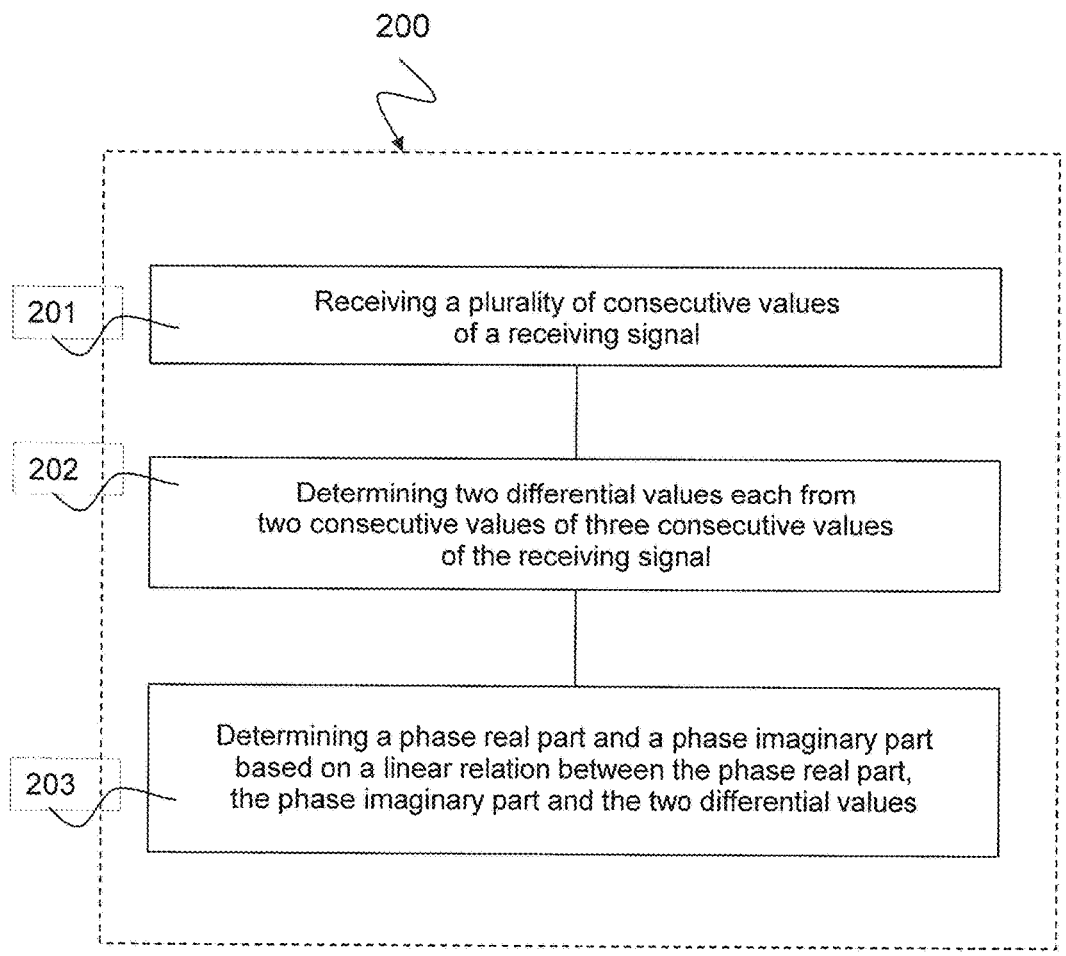
FIG. 2 shows a schematic view of a phase detection method 200 according to an embodiment.

FIG. 2 shows a schematic view of a phase detection method 200 according to an embodiment. The method 200 comprises receiving 201 a plurality of consecutive values of a receiving signal Y with a known sampling frequency $f_s$ as a reaction to a transmitting signal with a known transmitting frequency $f_w$. The method 200 comprises determining 202 two differential values ΔY1, ΔY2 from two consecutive values out of three consecutive values Y1, Y2, Y3 of the receiving signal Y in each case. The method 200 comprises determining 203 a phase real part U and a phase imaginary part V of the receiving signal Y based on a linear relation between the phase real part U, the phase imaginary part V and the two differential values ΔY1, ΔY2.

The linear relation between the phase real part U, the phase imaginary part V and the two differential values ΔY1, ΔY2 can be represented by a two-dimensional linear system of equations based on the two differential values ΔY1, ΔY2 as input variables and the phase real part U and the phase imaginary part V as output variables.

The linear system of equations can be solved by weighting of the input variables with Fourier Coefficients based on a known circular frequency Ω, said known circular frequency Ω depending on the transmitting frequency and the sampling frequency.

The known circular frequency Ω can satisfy the condition $\Omega = 2\pi(f_w/f_s)$.

The Fourier Coefficients can be identified before determining the phase real part U and the phase real part (V) of the receiving signal (Y) in dependence of the known circular frequency Ω.

A bias β of the receiving signal can be determined based on a linear relation between the phase real part U, the phase imaginary part V, the bias β and the three consecutive values Y1, Y2, Y3 of the receiving signal Y.

The following representation describes the theoretic principles of the method 200.

Three values $Y_0, Y_1, Y_2$ of a function $$Y(\tau) = \beta + A \sin(2\pi \cdot f_w \cdot \tau + \varphi) \tag{4}$$

are given, comprising the unknown parameters A, β and φ and the known transmitting frequency $f_w$. The three values $Y_0, Y_1, Y_2$ were measured at three equidistant points of time $$\tau_1, \tau_2 \text{ and } \tau_3 \tag{5}$$

so that the following applies:

$$\Delta\tau = \tau_2 - \tau_1 = \tau_3 - \tau_2 < \frac{1}{2 \cdot f_w}. \tag{6}$$

This condition (6) ensures (in the case of an absolute measuring accuracy) an exact reconstruction of the values $$U = A \cos(\varphi) \text{ and} \tag{7a}$$

$$V = A \sin(\varphi) \tag{7b}$$

and thus also of the values $$A = \sqrt{U^2 + V^2} \text{ and} \tag{8a}$$

$$\varphi = (\arcsin(V/A)) \mod 2\pi. \tag{8b}$$

The values U and V solve the following linear system of equations:

$$Y_1 = U \cdot S_1 + V \cdot C_1 + \beta$$

$$Y_2 = U \cdot S_2 + V \cdot C_2 + \beta,$$

$$Y_3 = U \cdot S_3 + V \cdot C_3 + \beta \tag{9}$$

wherein the following applies:

$$S_j = \sin(2\pi \cdot f_w \cdot \tau_j), j \in \{1,2,3\} \tag{10a}$$

$$C_j = \cos(2\pi \cdot f_w \cdot \tau_j), j \in \{1,2,3\}. \tag{10b}$$

After a few simple modifications, the system of equations (9) can be represented as follows:

$$Y_2 - Y_1 = U \cdot (S_2 - S_1) + V \cdot (C_2 - C_1) = 2\sin\left(\frac{\Omega}{2}\right)(U \cdot \hat{C}_1 - V \cdot \hat{S}_1) \quad (11)$$

$$Y_3 - Y_2 = U \cdot (S_3 - S_2) + V \cdot (C_3 - C_2) = 2\sin\left(\frac{\Omega}{2}\right)(U \cdot \hat{C}_2 - V \cdot \hat{S}_2),$$

wherein the following applies:

$$\Omega = 2\pi f_w \Delta\tau \quad (12)$$

and $$\hat{S}_j = \sin\left(\Omega \cdot \left(j + \frac{1}{2}\right)\right), j \in \{1, 2\} \quad (13a)$$

$$\hat{C}_j = \cos\left(\Omega \cdot \left(j + \frac{1}{2}\right)\right), j \in \{1, 2\}. \quad (13b)$$

Using the denotation $$\Delta Y_j = Y_{j+1} - Y_j, j \in \{1, 2\} \quad (14)$$

the following is obtained as a solution for the system (11):

$$U = \frac{\Delta Y_1 \cdot \hat{S}_2 - \Delta Y_2 \cdot \hat{S}_1}{2\sin\left(\frac{\Omega}{2}\right)\sin(\Omega)}, \quad (15a)$$

$$V = \frac{\Delta Y_1 \cdot \hat{C}_2 - \Delta Y_2 \cdot \hat{C}_1}{2\sin\left(\frac{\Omega}{2}\right)\sin(\Omega)}. \quad (15b)$$

A further reduction of variables can be obtained by the following substitution:

$$\hat{S}_2 = \hat{C}_1 \sin \Omega + \hat{S}_1 \cos \Omega, \quad (16a)$$

$$\hat{C}_2 = \hat{C}_1 \cos \Omega - \hat{S}_1 \sin \Omega, \quad (16b)$$

and $$\sin\Omega = 2\sin\left(\frac{\Omega}{2}\right)\cos\left(\frac{\Omega}{2}\right), \quad (17a)$$

$$\cos\Omega = 1 - 2\sin^2\left(\frac{\Omega}{2}\right). \quad (17b)$$

The constants $$\sin\left(\frac{\Omega}{2}\right) \text{ and } \cos\left(\frac{\Omega}{2}\right)$$

can thereby be treated as given parameters.

The value for β can thereby be determined from each of the following equations:

$$\beta = Y_j - (U \cdot S_j + V \cdot C_j) = Y_j - \left[U \cdot \left(\hat{S}_{j-1}\cos\left(\frac{\Omega}{2}\right) + \hat{C}_{j-1}\sin\left(\frac{\Omega}{2}\right)\right) + \quad (18)\right.$$

$$\left. V \cdot \left(\hat{C}_{j-1}\cos\left(\frac{\Omega}{2}\right) - \hat{S}_{j-1}\sin\left(\frac{\Omega}{2}\right)\right)\right],$$

$$j \in \{2, 3\}.$$

Receiving 201 a plurality of consecutive values of a receiving signal Y with a known sampling frequency $f_s$ as a reaction to a transmitting signal with a knowing transmitting frequency $f_w$ can be described using the equations (4) to (6).

Determining 202 two differential values ΔY1, ΔY2 each from two consecutive values out of three consecutive values Y1, Y2, Y3 of the receiving signal Y can be described by the system of equations (11).

Determining 203 a phase real part U and a phase imaginary part V of the receiving signal Y based on a linear relation between the phase real part U, the phase imaginary part V and the two differential values ΔY1, ΔY2 can be described by the equations (15a) and (15b).

Figure 3:
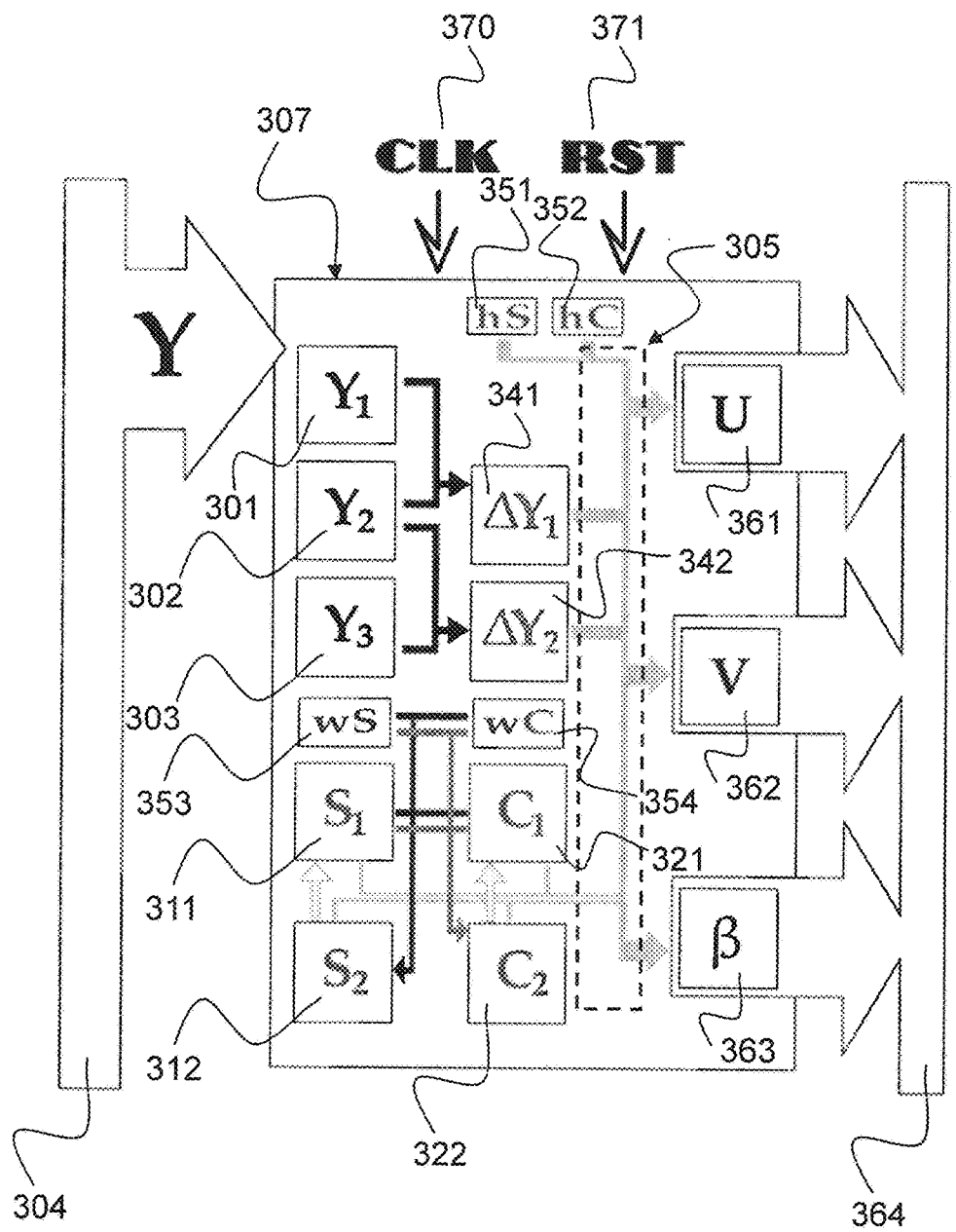
FIG. 3 shows a schematic view of a processor 300 for determining a phase of a receiving signal according to a first embodiment.

FIG. 3 shows a schematic view of a processor 300 for determining a phase of a receiving signal according to a first embodiment.

The processor 300 comprises a first input register 301, a second input register 302, a third input register 303, a first internal register 341, a second internal register 342, a first output register 361, a second output register 362, a third output register 363, a first coefficient register 321, a second coefficient register 311, a third coefficient register 322, a fourth coefficient register 312, a first parameter memory 352 or rather a parameter register, a second parameter memory 351 or rather a parameter register, a third parameter memory 354 or rather a parameter register, a fourth parameter memory 353 or rather a parameter register, a computing unit 305 and an instruction unit 307. The processor further comprises an inlet for a clock signal CLK 370 and an inlet for a reset signal RST 371. The processor 300 is coupled to an input data bus 304 at its inlet side and to an output data bus 364 at its outlet side. Coupling of the inlets and outlets, however, can also be realized in a different manner. The three input registers 301, 302, 303 can be realized as a FIFO memory and can record a new value of the receiving signal Y in every clock and simultaneously delete the oldest recorded value.

The processor is suitable for determining a phase of a receiving signal Y being received as a reaction to a transmitting signal with a known transmitting frequency $f_w$, said receiving signal Y having a known sampling frequency $f_s$.

The first input register 301, the second input register 302 and the third input register 303 serve to store three consecutive values Y1, Y2, Y3 out of a plurality of consecutive values of the receiving signal Y one after the other, e.g. when the values Y1, Y2 and Y3 of a plurality of four consecutive values of the input signal Y1, Y2, Y3, Y4 are loaded in a first clock and the values Y2, Y3 and Y4 are loaded in a second clock, Y1 being substituted by Y2, Y2 being substituted by Y3 and Y3 being substituted by Y4 and so forth.

The first internal register 341 serves to store a first differential value ΔY1 as a difference of the content Y2 of the second input register 302 and of the content Y1 of the first input register 301. The second internal register 342 serves to store a second differential value ΔY2 as a difference of the content Y3 of the third input register 303 and the content Y2 of the second input register 302.

The first output register 361 serves to provide a phase real part U of the receiving signal Y. The second output register 362 serves to provide a phase imaginary part V of the receiving signal Y.

The computing unit 305 serves to determine the phase real part U and the phase imaginary part V of the receiving signal Y based on a linear relation between the phase real part U, the phase imaginary part V and the two differential values ΔY1, ΔY2, for example according to the method 200 described in FIG. 2 or according to the manner described below.

The computing unit 305, which is shown here only as a box using dashed lines, can comprise arithmetic-logic units for executing arithmetic operations. It can comprise adders, multipliers and other units for executing computing operations.

The third output register 363 serves to provide a bias β of the receiving signal Y.

The computing unit 305 is further configured for determining the bias β of the receiving signal Y based on a linear relation between the phase real part U, the phase imaginary part V, the bias β and the three consecutive values Y1, Y2, Y3 of the receiving signal Y.

The four coefficient registers 321, 311, 322, 312 serve to store Fourier Coefficients, said Fourier Coefficients determining the linear relation between the phase real part U, the phase imaginary part V and the two differential values ΔY1, ΔY2.

The first parameter memory 352 serves to store the cosine hC of the half of the known circular frequency $\Omega=2\pi(f_w/f_s)$. The second parameter memory 351 serves to store the sine hS of the half of the known circular frequency Ω. The third parameter memory 354 serves to store the cosine wC of the known circular frequency Ω. The fourth parameter memory 353 serves to store the sine wS of the known circular frequency Ω.

The computing unit 305 further serves to determine the phase real part U and the phase imaginary part V of the receiving signal Y based on the contents C1, S1, C2, S2 of the four coefficient registers 321, 311, 322, 312 and the contents hC, hS, wC, wS of the four parameter memories 352, 351, 354, 353.

The instruction unit 307 is configured for initializing the first coefficient register 321 with the content hC of the first parameter memory 352 and for initializing the second coefficient register 311 with the content hS of the second parameter memory 351 in response to a reset signal 371. The instruction unit 307 serves to renew the first coefficient register 321 with the content C2 of the third coefficient register 322 and to renew the second coefficient register 311 with the content S2 of the fourth coefficient register 312 in response to a clock signal 370.

The instruction unit 307 is further configured for loading the fourth coefficient register 312 with the value $C_1 wS + S_1 wC$ in response to the clock signal 370 and for loading the third coefficient register 322 with the value $C_1 wC - S_1 wS$, wherein wS denotes the content of the fourth parameter memory 353, wC denotes the content of the third parameter memory 354, $C_1$ denotes the content of the first coefficient register 321, $S_1$ denotes the content of the second coefficient register 311 and Ω denotes the known circular frequency $\Omega=2\pi(f_w/f_s)$.

The computing unit 305 is configured for determining the phase real part U as $$\frac{\Delta Y_1 \cdot S_2 - \Delta Y_2 \cdot S_1}{4hS \cdot hS \cdot hC}$$

and the phase imaginary part V as $$\frac{\Delta Y_1 \cdot C_2 - \Delta Y_2 \cdot C_1}{4hS \cdot hS \cdot hC},$$

wherein hS denotes the content of the second parameter memory 351, hC denotes the content of the first parameter memory 352, $C_2$ denotes the content of the third coefficient register 322, $S_2$ denotes the content of the fourth coefficient register 312 and Ω denotes the known circular frequency $\Omega=2\pi(f_w/f_s)$.

The computing unit 305 is further configured for determining the bias β as $Y_2-(U \cdot (S_1 hC + C_1 hS) + V \cdot (C_1 hC - S_1 hS))$, wherein U denotes the phase real part, V denotes the phase imaginary part and $Y_2$ denotes the content of the second input register 302. However, the bias can also be determined according to a different formula according to the equation (18).

Figure 1:
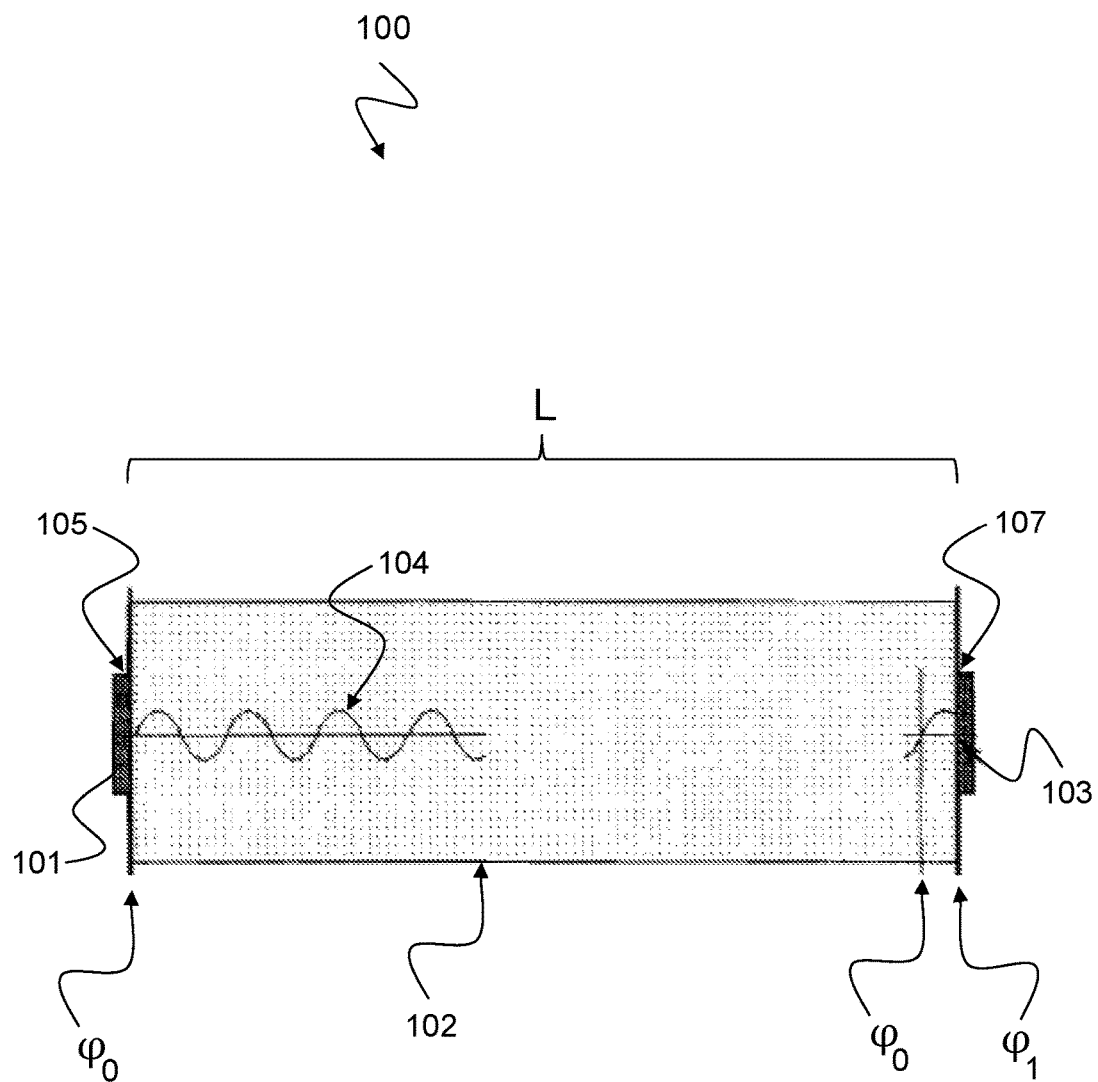
FIG. 1 shows a schematic view of a system 100 for measuring phase relations of acoustic waves in a vessel 102.

The processor 300 can be realized in hardware or in software. The processor 300 can form an operating unit on a chip or can be realized as a chip. The processor 300 can be a digital signal processor or a microcontroller. The processor 300 can be realized as an FPGA, as an integrated circuit, as an ASIC or as part of these components. The processor 300 can be realized in a receiver or as part of a receiver circuit, such as a receiver 103 as shown in FIG. 1.

The mode of operation of the processor 300 can be described as follows:

After starting the processor 300 or after receiving the reset signal RST 322, respectively, three consecutive values $Y_0$, $Y_1$, $Y_3$ of the receiving signal Y are loaded into the three input registers 301, 302, 303 from the input data bus 304.

The third coefficient register 322 and the fourth coefficient register 312 are deleted. The first coefficient register 321 is initialized with the following value:

$$hC = \cos\left(\frac{\Omega}{2}\right) \tag{19a}$$

and the second coefficient register 311 is initialized with the following value:

$$hS = \sin\left(\frac{\Omega}{2}\right). \tag{19b}$$

In every clock of the clock signal 370, the third coefficient register 322 is loaded with the following value:

$$C_1 wC - S_1 wS \tag{20a}$$

and the fourth coefficient register 312 is loaded with the following value:

$$C_1 wS + S_1 wC, \tag{20b}$$

wherein the following applies:

$$wS = \sin \Omega, \tag{21a}$$

$$wC = \cos \Omega. \tag{21b}$$

The first output register 361 is loaded with the following value:

$$U = \frac{\Delta Y_1 \cdot S_2 - \Delta Y_2 \cdot S_1}{4hS \cdot hS \cdot hC}, \tag{22a}$$

and the second output register 362 is loaded with the following value:

$$V = \frac{\Delta Y_1 \cdot C_2 - \Delta Y_2 \cdot C_1}{4hS \cdot hS \cdot hC}, \tag{22b}$$

and the value $$Y_2 - (U \cdot (S_1 hC + C_1 hS) + V \cdot (C_1 hC - S_1 hS)) \tag{23}$$

is loaded into the third output register 363.

Then the first coefficient register 321 is overwritten with the content $C_2$ of the third coefficient register 322 and the second coefficient register 311 is overwritten with the content $S_2$ of the fourth coefficient register 312. The first input register 301 is overwritten with the content $Y_2$ of the second input register 302, the second input register 302 is overwritten with the content $Y_3$ of the third input register 303 and a new input value $Y_4$ is loaded into the third input register 303 from the input data bus 304. The values U, V and β of the three output registers 361, 362, 363 are transferred to the output data bus 364.

Figure 4:
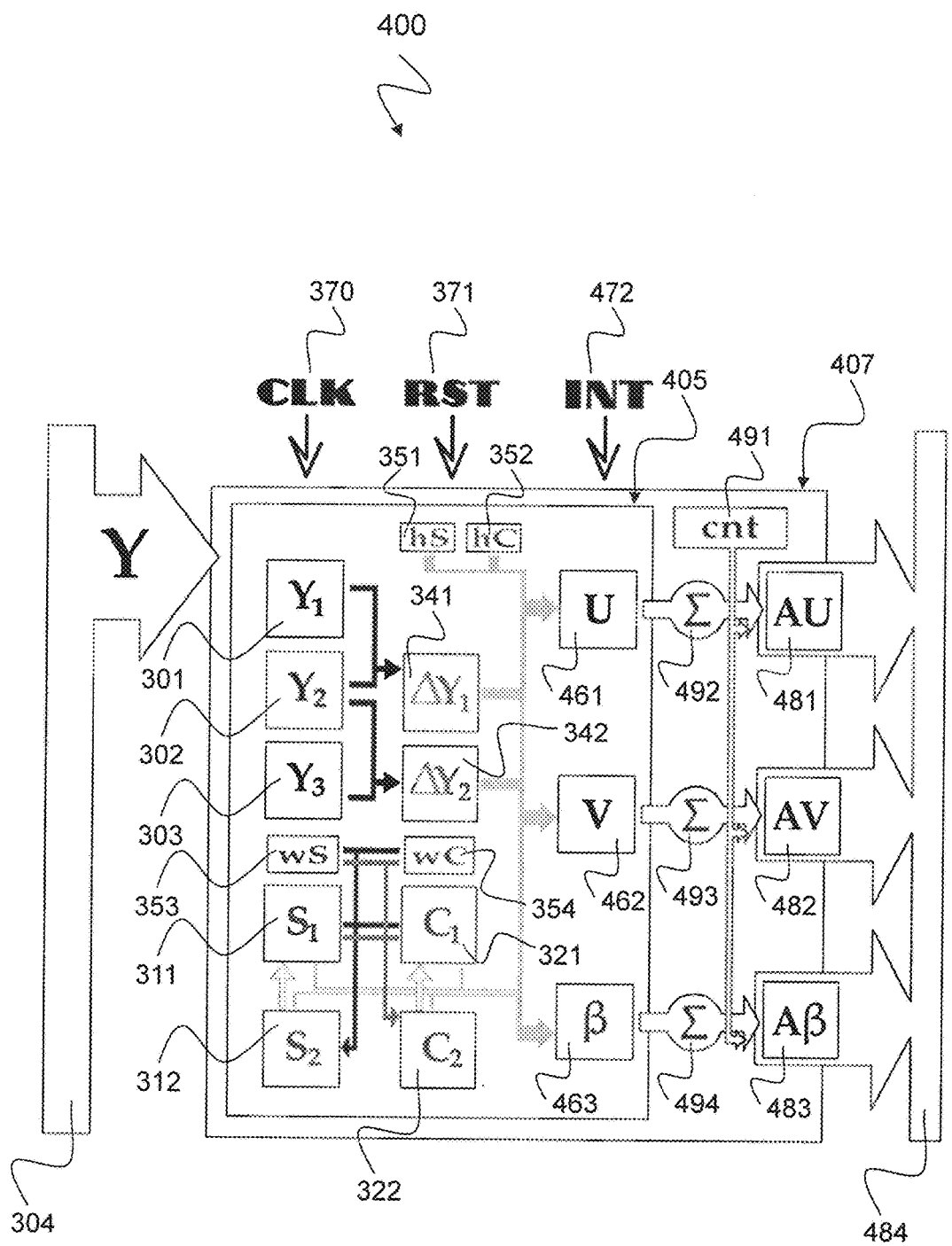
FIG. 4 shows a schematic view of a processor 400 for determining a phase of a receiving signal according to a second embodiment.

FIG. 4 shows a schematic view of a processor 400 for determining a phase of a receiving signal according to a second embodiment.

The processor 400 is constructed similar to the processor 300 described in FIG. 3. The processor 400 comprises, as does the processor 300, a first input register 301, a second input register 302, a third input register 303, a first internal register 341, a second internal register 342, a first output register 461, a second output register 462, a third output register 463, a first coefficient register 321, a second coefficient register 311, a third coefficient register 322, a fourth coefficient register 312, a first parameter memory 352, a second parameter memory 351, a third parameter memory 354, a fourth parameter memory 353, a computing unit 405 and an instruction unit 407. The processor 400 further comprises an inlet for a clock signal CLK 370 and an inlet for a reset signal RST 470. The processor is coupled to an input data bus 304 at its inlet side and to an output data bus 464 at its outlet side. Regarding the mode of operation of the units mentioned above, reference is made to the description of FIG. 3, although the computing unit has the reference number 405 due to the additional mode of operation and the instruction unit has the reference number 407 due to the additional mode of operation.

Unlike the processor 300, the processor 400 further comprises a fourth output register or first auxiliary register 481, respectively, a fifth output register or a second auxiliary register 482, respectively, a sixth output register or a third auxiliary register 483, respectively, three summation members 492, 493, 494, a counter 491 and an inlet for an interruption signal INT 472.

The counter 491 is incremented with each renewal of the three input registers 301, 302, 303 in dependence of the clock signal 370.

The computing unit 405 is further configured for determining the phase real part U as $\Delta Y_1 S_2 - \Delta Y_2 S_1$ and the phase imaginary part V as $\Delta Y_1 C_2 - \Delta Y_2 C_1$, for adding the phase real part U to the first auxiliary register 481 and for adding the phase imaginary part V to the second auxiliary register 482.

The instruction unit 407 is further configured for outputting the values AU, AV of the two auxiliary registers 481, 482 divided by the value 2·wS·hS=4hS·hS·hC and divided by a value cnt of the counter 491 in response to the interruption signal. Thereby, $\Delta Y_1$ denotes the content of the first internal register 341, $\Delta Y_2$ denotes the content of the second internal register 342, $C_2$ denotes the content of the third coefficient register 322, $S_2$ denotes the content of the fourth coefficient register 312, hS denotes the content of the second parameter memory 351 and hC denotes the content of the first parameter memory 352. Ω denotes the known circular frequency $\Omega = 2\pi(f_w/f_s)$.

The processor 400 can be realized in hardware or in software. The processor 400 can form an operating unit on a chip or can be realized as a chip. The processor 400 can be a digital signal processor or a microcontroller. The processor 400 can be realized as an FPGA, as an integrated circuit, as an ASIC or as part of these components. The processor 400 can be realized in a receiver or as part of a receiver circuit, such as a receiver 103 as shown in FIG. 1.

The mode of operation of the processor 400 can be described as follows:

After starting the processor 400 or after receiving the reset signal RST 322, respectively, three consecutive values $Y_0$, $Y_1$, $Y_3$ of the receiving value Y are loaded into the three input registers 301, 302, 303 from the input data bus 304.

The three coefficient register 322 and the forth coefficient register 312 are deleted. The first coefficient register 321 is initialized with the following value:

$$hC = \cos\left(\frac{\Omega}{2}\right) \tag{24a}$$

and the second coefficient register 311 is initialized with the following value:

$$hS = \sin\left(\frac{\Omega}{2}\right). \tag{24b}$$

In every clock of the clock signal 370, the third coefficient register 322 is loaded with the following value:

$$C_1 wC - S_1 wS \tag{25a}$$

and the fourth coefficient register 312 is loaded with the following value:

$$C_1 wS + S_1 wC, \tag{25b}$$

wherein the following applies:

$$wS = \sin \Omega, \tag{26a}$$

$$wC = \cos \Omega. \tag{26b}$$

The first output register 461 is loaded with the following value:

$$U = \Delta Y_1 \cdot S_2 - \Delta Y_2 \cdot S_1, \tag{27a}$$

which is also added to the forth output register 481, for which the first summation member 492 is used.

The second output register 362 is loaded with the following value:

$$V = \Delta Y_1 \cdot C_2 - \Delta Y_2 \cdot C_1, \tag{27b}$$

which is also added to the fifth output register 482, for which the second summation member 493 is used.

The value $$Y_2 - \frac{(U \cdot (S_1 wC + C_1 wS) + V \cdot (C_1 wC - S_1 wS))}{4 \cdot hS \cdot hS \cdot hC} \tag{28}$$

is loaded into the output register 463.

Then the first coefficient register 321 is overwritten with the content $C_2$ of the third coefficient register 322 and the second coefficient register 311 is overwritten with the content $S_2$ of the fourth coefficient register 312. The counter 491 is incremented. The first input register 301 is overwritten with the content $Y_2$ of the second input register 302, the second input register 302 is overwritten with the content $Y_3$ of the third input register 303 and a new input value $Y_4$ is loaded into the third input register 303 from the input data bus 304.

As soon as there is an interruption, meaning as soon as the interruption signal 472 signals an interruption, the content AU of the fourth output register 481 and the content AV of the fifth output register 482 are divided by the value 2wShS (=4hShShC) and their values as well as the value β of the third output register 463, each divided by the value cnt of the counter 491, are transferred to the output data bus 484.

After this, the reset signal 371 is transmitted.

The processor 300 according to the description of FIG. 3 as well as the processor 400 according to the description of FIG. 4 are suitable for implementing the method 200 described in FIG. 2.

An aspect of the invention also comprises a computer program product, which can be uploaded directly into the internal memory of a digital computer and comprises software code sections, by means of which the method 200 described in FIG. 2 can be carried out when the product is running on a computer. The computer program product can be stored on a medium suitable for computers and can comprise the following: machine-readable programming means, which cause a computer to receive 201 a plurality of consecutive values of a receiving signal Y with a known sampling frequency $f_s$ as a reaction to a transmitting signal with a known transmitting frequency $f_w$; to determine 202 two differential values ΔY1, ΔY2 each from two consecutive values out of three consecutive values Y1, Y2, Y3 of the receiving signal Y; and to determine 203 a phase real part U and a phase imaginary part V of the receiving signal Y based on a linear relation between the phase real part U, the phase real part V and the two differential values ΔY1, ΔY2.

The computer can be a PC, for example a PC of a computer network. The computer can be realized as a chip, an ASIC, a microprocessor, a signal processor or as a processor in general and can be implemented as a processor as described in FIGS. 3 to 5, for example.

It is understood that the features of the different exemplary embodiments described herein can be combined with one another, except when explicitly indicated otherwise. As shown in the description and the drawings, individual elements, which are shown in connection with one another, do not have to be directly connected to one another; intermediate elements can be provided between the connected elements. Furthermore, it is understood that embodiments of the invention can be implemented in individual circuits, partially integrated circuits or entirely integrated circuits or programming means. The terms "such as" and "for example" solely refer to an exemplary embodiment and not to the best or the ideal embodiment. Certain embodiments were depicted and described herein, although it is obvious to the skilled person that a plurality of alternative and/or similar implementations can be realized in place of the embodiments shown and described, without deviating from the concept of the present invention.

LIST OF REFERENCES

100: system 100 for measuring phase relations of acoustic waves in a vessel
101: transmitter
102: vessel
103: receiver
104: ultrasonic wave
105: inlet
107: outlet
200: phase detection method 200
201: $1^{st}$ method step: receiving
202: $2^{nd}$ method step: determining
203: $3^{rd}$ method step: determining
300: processor, suitable for determining a phase of a receiving signal
301: first input register
302: second input register
303: third input register
304: input data bus
305: computing unit
307: instruction unit
311: second coefficient register
312: fourth coefficient register
321: first coefficient register
322: third coefficient register
341: first internal register
342: second internal register
351: second parameter memory
352: first parameter memory
353: fourth parameter memory
354: third parameter memory
361: first output register
362: second output register
363: third output register
364: output data bus
370: clock signal
371: reset signal
400: processor, suitable for determining a phase of a receiving signal
405: computing unit
407: instruction unit
484: output data bus
472: interruption signal
481: fourth output register or first auxiliary register
482: fifth output register or second auxiliary register
483: sixth output register or third auxiliary register
491: counter
492: first summation member
493: second summation member
494: third summation member

The invention claimed is:

1. A phase detection method comprising the following steps:
   receiving a plurality of consecutive values of a receiving signal (Y) with a known sampling frequency $f_s$ as a reaction to a transmitting signal with a known transmitting frequency $f_w$;
   determining two differential values (ΔY1, ΔY2), each coming from two consecutive values out of three consecutive values (Y1, Y2, Y3) of the receiving signal (Y); and
   determining a phase real part (U) and a phase imaginary part (V) of the receiving signal (Y) based on a linear relation between the phase real part (U), the phase imaginary part (V) and the two differential values (ΔY1, ΔY2).

2. The phase detection method according to claim 1, wherein the linear relation between the phase real part (U), the phase imaginary part (V) and the two differential values (ΔY1, ΔY2) can be represented by a two-dimensional linear system of equations based on the two differential values (ΔY1, ΔY2) as input variables and the phase real part (U) and the phase imaginary part (V) as output variables.

3. The phase detection method according to claim 2, wherein the linear system of equations is solved by weighting of the input variables with Fourier Coefficients based on a known circular frequency $\Omega$, wherein said known circular frequency $\Omega$ depends on the transmitting frequency $f_w$ and the sampling frequency $f_s$.

4. The phase detection method according to claim 3, wherein the known circular frequency $\Omega$ satisfies the following condition: $\Omega=2\pi(f_w/f_s)$.

5. The phase detection method according to claim 3 including determining the Fourier Coefficients in dependence of the known circular frequency $\Omega$ before determining the phase real part (U) and the phase imaginary part (V) of the receiving signal (Y).

6. The phase detection method according to claim 1 including determining a bias ($\beta$) of the receiving signal (Y) based on a linear relation between the phase real part (U), the phase imaginary part (V), the bias ($\beta$), and the three consecutive values (Y1, Y2, Y3) of the receiving signal (Y).

7. A processor for determining a phase of a receiving signal (Y) received as a reaction to a transmitting signal with a known transmitting frequency $f_w$, said receiving signal (Y) having a known sampling frequency $f_s$, said processor comprising:
a first input register, a second input register, and a third input register, each input register being configured for storing one of three consecutive values (Y1, Y2, Y3) from a plurality of consecutive values of the receiving signal (Y) one after the other;
a first internal register and a second internal register, each of which being configured for storing either a first differential value ($\Delta Y1$) as a difference of the content (Y2) of the second input register and the content (Y1) of the first input register or a second differential value ($\Delta Y2$) as a difference of the content (Y3) of the third input register and the content (Y2) of the second input register;
a first output register and a second output register, each of which being configured for providing either a phase real part (U) or a phase imaginary part (V) of the receiving signal (Y); and
a computing unit configured for determining the phase real part (U) and the phase imaginary part (V) of the receiving signal (Y) based on a linear relation between the phase real part (U), the phase imaginary part (V), and the two differential values ($\Delta Y1$, $\Delta Y2$).

8. The processor according to claim 7 including a third output register configured for providing a bias ($\beta$) of the receiving signal (Y), wherein the computing unit is configured for determining the bias ($\beta$) of the receiving signal (Y) based on a linear relation between the phase real part (U), the phase imaginary part (V), the bias ($\beta$), and the three consecutive values (Y1, Y2, Y3) of the receiving signal (Y).

9. The processor according to claim 8 including a first coefficient register, a second coefficient register, a third coefficient register, and a fourth coefficient register, each of which being configured for storing Fourier Coefficients, wherein said Fourier Coefficients determine a linear relation between the phase real part (U), the phase imaginary part (V), and the two differential values ($\Delta Y1$, $\Delta Y2$).

10. The processor according to claim 9 including a first parameter memory, a second parameter memory, a third parameter memory, and a fourth parameter memory, said first parameter memory being configured for storing a cosine (hC) of a half of a known circular frequency $\Omega$, which depends on the transmitting frequency $f_w$ and the sampling frequency $f_s$, said second parameter memory being configured for storing a sine (hS) of the half of the known circular frequency $\Omega$, said third parameter memory being configured for storing a cosine (wC) of the known circular frequency $\Omega$, and said fourth parameter memory being configured for storing a sine (wS) of the known circular frequency $\Omega$.

11. The processor according to claim 10, wherein the known circular frequency $\Omega$ satisfies the following condition: $\Omega=2\pi(f_w/f_s)$.

12. The processor according to claim 10, wherein the computing unit is configured for determining the phase real part (U) and the phase imaginary part (V) of the receiving signal (Y) based on the contents (C1, S1, C2, S2) of the four coefficient registers and the contents (hC, hS, wC, wS) of the four parameter memories.

13. The processor according to claim 12 including an instruction unit configured for initializing the first coefficient register with the content (hC) of the first parameter memory and for initializing the second coefficient register with the content (hS) of the second parameter memory in response to a reset signal, and for renewing the first coefficient register with the content (C2) of the third coefficient register and for renewing the second coefficient register with the content (S2) of the fourth coefficient register in response to a clock signal, wherein the instruction unit is configured for loading the fourth coefficient register with the value $C_1wS+S_1wC$ and for loading the third coefficient register with the value $C_1wC-S_1wS$ in response to the clock signal, wherein wS denotes the content of the fourth parameter memory, wC denotes the content of the third parameter memory, $C_1$ denotes the content of the first coefficient register, $S_1$ denotes the content of the second coefficient register, and $\Omega$ denotes the known circular frequency $\Omega=2\pi(f_w/f_s)$, wherein the computing unit is configured for determining the phase real part (U) as $$\frac{\Delta Y_1 \cdot S_2 - \Delta Y_2 \cdot S_1}{4hS \cdot hS \cdot hC}$$

and the phase imaginary part (V) as $$\frac{\Delta Y_1 \cdot C_2 - \Delta Y_2 \cdot C_1}{4hS \cdot hS \cdot hC},$$

wherein hS denotes the content of the second parameter memory, hC denotes the content of the first parameter memory, $C_2$ denotes the content of the third coefficient register, $S_2$ denotes the content of the fourth coefficient register, and $\Omega$ denotes the known circular frequency $\Omega=2\pi(f_w/f_w)$.

14. The processor according to claim 13, wherein the computing unit is configured for determining the bias ($\beta$) as $Y_2-(U \cdot (S_1hC+C_1hS)+V \cdot (C_1hC-S_1hS))$, wherein U denotes the phase real part, V denotes the phase imaginary part, and $Y_2$ denotes the content of the second input register.

15. The processor according to claim 12 including a first auxiliary register, a second auxiliary register, and a counter incremented at every renewal of the three input registers depending on the clock signal, wherein the computing unit is configured for determining the phase real part (U) as $\Delta Y_1 S_2 - \Delta Y_2 S_1$ and the phase imaginary part (V) as $\Delta Y_1 C_2 - \Delta Y_2 C_1$, for adding the phase real part (U) to the first auxiliary register and for adding the phase imaginary part (V) to the second auxiliary register, wherein the instruction unit is configured for outputting the values (AU, AV) of the two auxiliary registers divided by the value $2 \cdot wS \cdot hS = 4hS \cdot hS \cdot hC$ and divided by a value (cnt) of the counter in response to an interruption signal, wherein $\Delta Y_1$ denotes the content of the first internal register, $\Delta Y_2$ denotes the content of the second internal register, $C_2$ denotes the content of the third coefficient register, $S_2$ denotes the content of the fourth coefficient register, hS denotes the content of the second parameter memory and hC denotes the content of the first parameter memory, and $\Omega$ denotes the known circular frequency $\Omega = 2\pi(f_n/f_s)$.

* * * * *